(12) United States Patent
Kulshreshtha et al.

(10) Patent No.: US 12,211,694 B2
(45) Date of Patent: *Jan. 28, 2025

(54) ULTRA-HIGH MODULUS AND ETCH SELECTIVITY BORON-CARBON HARDMASK FILMS

(71) Applicant: Applied Materials, Inc., Santa Clara, CA (US)

(72) Inventors: Prashant Kumar Kulshreshtha, San Jose, CA (US); Ziqing Duan, San Jose, CA (US); Karthik Thimmavajjula Narasimha, San Francisco, CA (US); Kwangduk Douglas Lee, Redwood City, CA (US); Bok Hoen Kim, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,514

(22) Filed: Jun. 6, 2023

(65) Prior Publication Data

US 2023/0317455 A1  Oct. 5, 2023

Related U.S. Application Data

(60) Continuation of application No. 17/220,441, filed on Apr. 1, 2021, now Pat. No. 11,728,168, which is a
(Continued)

(51) Int. Cl.
*H01L 21/033* (2006.01)
*C23C 16/32* (2006.01)
(Continued)

(52) U.S. Cl.
CPC .......... *H01L 21/0338* (2013.01); *C23C 16/32* (2013.01); *C23C 16/505* (2013.01);
(Continued)

(58) Field of Classification Search
CPC .......... H01L 21/0338; H01L 21/02112; H01L 21/02274; H01L 21/0332; H01L 21/0335;
(Continued)

(56) References Cited

U.S. PATENT DOCUMENTS 6,001,461 A   12/1999  Toyoda et al.
6,261,726 B1   7/2001  Brooks et al.
(Continued)

FOREIGN PATENT DOCUMENTS

CN   101548368 A   9/2009
CN   102971837 A   3/2013
(Continued)

OTHER PUBLICATIONS

Korean Office Action dated Jul. 28, 2023, for Korean Patent Application No. 10-2018-7013101.
(Continued)

*Primary Examiner* — Duy Vu N Deo
(74) *Attorney, Agent, or Firm* — Patterson + Sheridan, LLP

(57) ABSTRACT

Implementations of the present disclosure generally relate to the fabrication of integrated circuits. More particularly, the implementations described herein provide techniques for deposition of boron-carbon films on a substrate. In one implementation, a method of processing a substrate is provided. The method comprises flowing a hydrocarbon-containing gas mixture into a processing volume of a processing chamber having a substrate positioned therein, wherein the substrate is heated to a substrate temperature from about 400 degrees Celsius to about 700 degrees Celsius, flowing a boron-containing gas mixture into the processing volume and generating an RF plasma in the processing volume to deposit a boron-carbon film on the heated substrate, wherein the boron-carbon film has an elastic modulus of from about
(Continued)

200 to about 400 GPa and a stress from about −100 MPa to about 100 MPa.

19 Claims, 9 Drawing Sheets

Related U.S. Application Data division of application No. 16/219,557, filed on Dec. 13, 2018, now Pat. No. 10,971,364, which is a continuation of application No. 15/233,351, filed on Aug. 10, 2016, now Pat. No. 10,418,243.

(60) Provisional application No. 62/239,645, filed on Oct. 9, 2015.

(51) Int. Cl.
  *C23C 16/505* (2006.01)
  *H01L 21/02* (2006.01)
  *H01L 21/3065* (2006.01)

(52) U.S. Cl.
  CPC .. *H01L 21/02112* (2013.01); *H01L 21/02274* (2013.01); *H01L 21/0332* (2013.01); *H01L 21/0335* (2013.01); *H01L 21/0337* (2013.01); *H01L 21/3065* (2013.01)

(58) Field of Classification Search
  CPC ............. H01L 21/0337; H01L 21/3065; H01L 21/02532; H01L 21/0262; C23C 16/32; C23C 16/505; C23C 16/24; C23C 16/36
  See application file for complete search history.

(56) References Cited

U.S. PATENT DOCUMENTS

| | | | |
|---|---|---|---|
| 6,424,044 B1 | 7/2002 | Han et al. | |
| 7,064,078 B2 | 6/2006 | Liu et al. | |
| 7,312,162 B2 | 12/2007 | Ramaswamy et al. | |
| 7,422,775 B2 | 9/2008 | Ramaswamy et al. | |
| 7,429,532 B2 | 9/2008 | Ramaswamy et al. | |
| 7,576,441 B2 | 8/2009 | Yin et al. | |
| 7,611,751 B2 | 11/2009 | Elers | |
| 7,638,440 B2 | 12/2009 | Wang et al. | |
| 7,670,924 B2 | 3/2010 | Demos et al. | |
| 7,718,081 B2 | 5/2010 | Liu et al. | |
| 7,981,810 B1 | 7/2011 | Subramonium et al. | |
| 8,536,065 B2 | 9/2013 | Seamons et al. | |
| 8,993,454 B2 | 3/2015 | Seamons et al. | |
| 10,418,243 B2 * | 9/2019 | Kulshreshtha | .... H01L 21/02274 |
| 11,728,168 B2 * | 8/2023 | Kulshreshtha | ........ C23C 16/505 |
| | | | 438/695 |
| 2004/0087139 A1 | 5/2004 | Yeh et al. | |
| 2004/0087179 A1 | 5/2004 | San et al. | |
| 2005/0042879 A1 | 2/2005 | Yin et al. | |
| 2005/0056940 A1 | 3/2005 | Sandhu et al. | |
| 2005/0202683 A1 | 9/2005 | Wang et al. | |
| 2007/0128538 A1 | 6/2007 | Fairbairn et al. | |
| 2007/0286954 A1 | 12/2007 | Tang et al. | |
| 2009/0017640 A1 | 1/2009 | Huh et al. | |
| 2009/0286402 A1 | 11/2009 | Xia et al. | |
| 2010/0032838 A1 | 2/2010 | Kikuchi et al. | |
| 2010/0291713 A1 | 11/2010 | Lee et al. | |
| 2011/0133313 A1 | 6/2011 | Rangarajan et al. | |
| 2012/0080779 A1 | 4/2012 | Seamons et al. | |
| 2012/0258261 A1 * | 10/2012 | Reddy | ................. H01L 21/0332 |
| | | | 427/577 |
| 2013/0062753 A1 | 3/2013 | Nguyen et al. | |
| 2013/0171839 A1 | 7/2013 | Nguyen et al. | |
| 2014/0017897 A1 | 1/2014 | Seamons et al. | |
| 2014/0206097 A1 | 7/2014 | Jeong et al. | |
| 2014/0213059 A1 | 7/2014 | Doan et al. | |
| 2014/0213062 A1 | 7/2014 | Shimizu et al. | |
| 2014/0216498 A1 | 8/2014 | Lee et al. | |
| 2015/0194317 A1 | 7/2015 | Manna et al. | |
| 2015/0287591 A1 | 10/2015 | Pore et al. | |
| 2016/0002115 A1 | 1/2016 | Subhash et al. | |

FOREIGN PATENT DOCUMENTS

| | | |
|---|---|---|
| CN | 103210480 A | 7/2013 |
| CN | 103443909 A | 12/2013 |
| KR | 20130118880 A | 10/2013 |
| KR | 10-2015-0037638 | 4/2015 |
| TW | 200615394 A | 5/2006 |
| TW | 201216331 A | 4/2012 |
| TW | 201534407 A | 9/2015 |
| WO | 2007085494 A1 | 8/2007 |
| WO | 2013061398 A1 | 5/2013 |

OTHER PUBLICATIONS

Korean Office Action dated Aug. 7, 2023, for Korean Patent Application No. 10-2018-7036743.
International Search Report and Written Opinion for International Application No. PCT/US2016/046548 dated Nov. 10, 2016.
International Search Report and Written Opinion dated Apr. 17, 2012 for Application No. PCT/US2011/054145.
U.S. Office Action dtd Apr. 24, 2017 for U.S. Appl. No. 15/233,351.
U.S. Office Action dtd Dec. 11, 2017 for U.S. Appl. No. 15/233,351.
U.S. Office Action dtd Sep. 13, 2018 for U.S. Appl. No. 15/233,351.
Office Action for Taiwan Application No. 105126857 dated Apr. 23, 2019.
Search Report for Taiwan Application No. 105126857 dated Apr. 23, 2019.
Office Action for Taiwan Application No. 107144912 dated Sep. 12, 2019.
Search Report for Taiwan Application No. 107144912 dated Sep. 10, 2019.
Office Action for Taiwan Application No. 108125950 dated Oct. 18, 2019.
Search Report for Taiwan Application No. 108125950 dated Oct. 18, 2019.
Office Action for Japan Application No. 2018-517285 dated Oct. 23, 2019.
Office Action for U.S. Appl. No. 16/219,557 dated Jan. 22, 2020.
Final Office Action for U.S. Appl. No. 16/219,557 dated Sep. 1, 2020.
Chinese Office Action dated Nov. 17, 2021 for Application No. 201680056619.1.
Chinese Office Action dated Oct. 18, 2022 for Application No. 201811561845.2.

* cited by examiner

ULTRA-HIGH MODULUS AND ETCH SELECTIVITY BORON-CARBON HARDMASK FILMS

CROSS-REFERENCE TO RELATED APPLICATIONS

This application is a continuation of U.S. patent application Ser. No. 17/220,441, filed Apr. 1, 2021, which is a divisional of U.S. patent application Ser. No. 16/219,557, filed Dec. 13, 2018 (now issued as U.S. Pat. No. 10,971,364), which is a continuation of U.S. patent application Ser. No. 15/233,351, filed Aug. 10, 2016 (now issued as U.S. Pat. No. 10,418,243), which claims benefit of U.S. Provisional Patent Application No. 62/239,645, filed Oct. 9, 2015, all of which are herein incorporated by reference in their entireties.

BACKGROUND

Field

Implementations of the present disclosure generally relate to the fabrication of integrated circuits. More particularly, the implementations described herein provide techniques for deposition of boron-carbon films on a substrate.

Description of the Related Art

Integrated circuits have evolved into complex devices that can include millions of transistors, capacitors and resistors on a single chip. The evolution of chip designs continually calls for faster circuitry and greater circuit density. The demands for faster circuits with greater circuit densities impose corresponding demands on the materials used to fabricate such integrated circuits. In particular, as the dimensions of integrated circuit components are reduced to the nanometer scale, it is now necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist must correspondingly be reduced in order to control pattern resolution. Such thin resist layers can be insufficient to mask underlying material layers during the pattern transfer step due to attack by the chemical etchant. An intermediate layer, called a hardmask, is often used between the energy sensitive resist layer and the underlying material layers to facilitate pattern transfer because of its greater resistance to the chemical etchant. It is desirable to have thin hardmasks that have both high etch selectivity and are easy to remove after the etching process is complete. As critical dimensions (CD) decrease, current hardmask materials lack the desired etch selectivity relative to underlying materials and are often difficult to remove.

Boron-carbon films have good mechanical properties, excellent step coverage, good wet etch resistance and a high dry etch selectivity for low dielectric films. All of these characteristics are beneficial for applications such as lithographic hard masks to low-k dielectric etching and self-aligned double-patterning processes. However, due to their amorphous nature, amorphous boron films tend to have a high film stress which causes line bending damaging the integrated circuit. Amorphous carbon films have poor etch selectivity, which necessitates thick hardmasks. Thick hardmasks are not suitable due to decreased transparency, and pattern bending or collapse at higher aspect ratios.

Therefore there is a need for a transparent hardmask film with improved etch selectivity. There is also a need for methods for depositing improved hardmask layers.

SUMMARY

Implementations of the present disclosure generally relate to the fabrication of integrated circuits. More particularly, the implementations described herein provide techniques for deposition of boron-carbon films on a substrate. In one implementation, a method of processing a substrate is provided. The method comprises flowing a hydrocarbon-containing gas mixture into a processing volume of a processing chamber having a substrate positioned therein, wherein the substrate is heated to a substrate temperature from about 400 degrees Celsius to about 700 degrees Celsius, flowing a boron-containing gas mixture into the processing volume and generating an RF plasma in the processing volume to deposit a boron-carbon film on the heated substrate, wherein the boron-carbon film has an elastic modulus of from about 200 GPa to about 400 GPa and a stress from about −100 MPa to about 100 MPa.

In another implementation, a method of processing a substrate is provided. The method comprises flowing a hydrocarbon-containing gas mixture into a processing volume of a processing chamber having a substrate positioned therein, wherein the substrate is heated to a substrate temperature from about 400 degrees Celsius to about 700 degrees Celsius, and wherein the boron-containing gas mixture comprises diborane ($B_2H_6$), flowing a boron-containing gas mixture into the processing volume, wherein the hydrocarbon-containing gas mixture comprises propylene ($C_3H_6$), and generating an RF plasma in the processing volume to deposit a boron-carbon film on the heated substrate, wherein the boron-carbon film has an elastic modulus of from about 200 to about 400 GPa and a stress from about −100 MPa to about 100 MPa.

In yet another implementation, a method of processing a substrate is provided. The method comprises flowing a hydrocarbon-containing gas mixture into a processing volume of a processing chamber having a substrate positioned therein, wherein the substrate is heated to a substrate temperature from about 400 degrees Celsius to about 700 degrees Celsius, flowing a boron-containing gas mixture into the processing volume, stabilizing a pressure in the processing volume for a predefined RF-on delay time period, generating an RF plasma in the processing volume to deposit a boron-carbon film on the heated substrate, wherein the boron-carbon film has an elastic modulus of from about 200 to about 400 GPa and a stress from about −100 MPa to about 100 MPa, forming a patterned photoresist layer over the boron-carbon film, etching the boron-carbon film in a pattern corresponding with the patterned photoresist layer, etching the pattern into the substrate, and depositing a material into the etched portions of the boron-carbon film.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
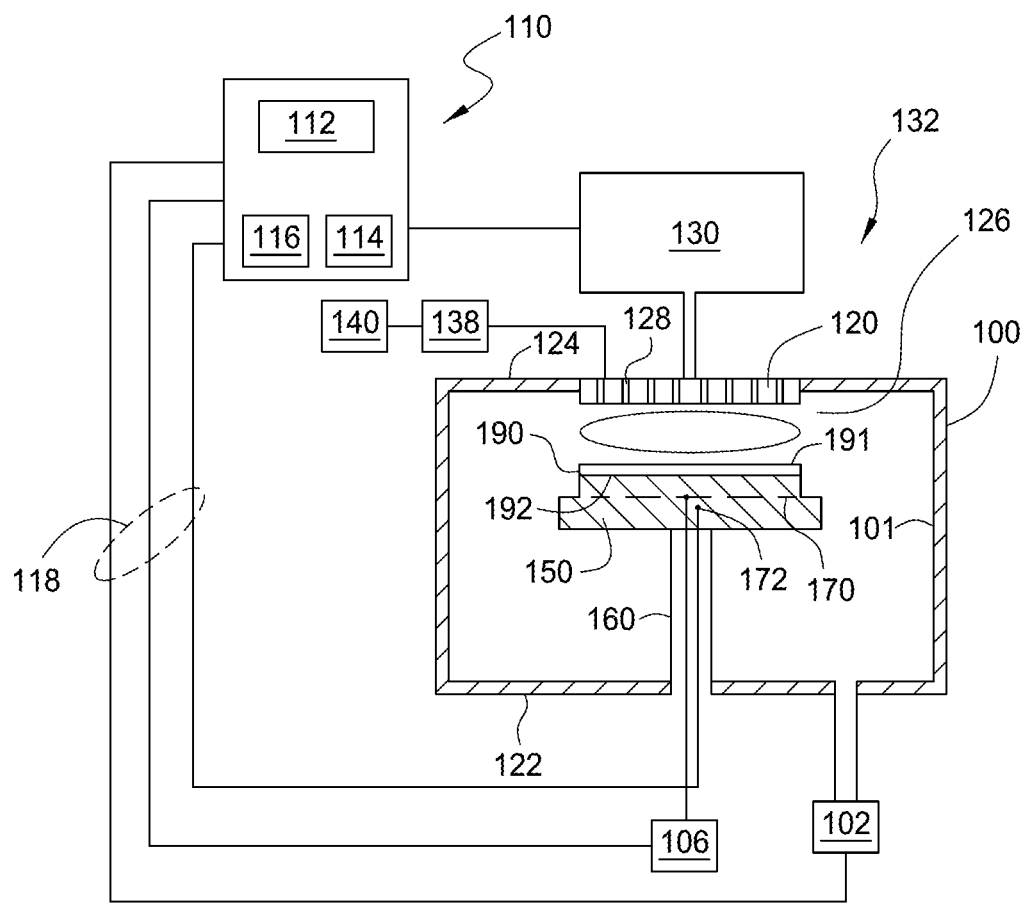
FIG. 1 depicts a schematic illustration of an apparatus that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure describes techniques for deposition of boron-carbon films on a substrate with high modulus and etch selectivity. Certain details are set forth in the following description and in FIGS. 1-7D to provide a thorough understanding of various implementations of the disclosure. Other details describing well-known structures and systems often associated with boron-carbon films are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Hardmasks having high etch selectivity are the cornerstone for development of devices of ~10 nanometers or smaller in dimension. Current low temperature boron-containing carbon hardmasks achieve good etch selectivity, mechanical strength, transparency and ease of stripping compared to previous amorphous carbon hardmask films. However, the amorphous nature, higher incorporated hydrogen and lower modulus (~100 GPa) of low temperature boron-containing hardmask films limit fabrication of high aspect-ratio features and smaller dimension devices. To enable next-generation integrated circuit chipsets, implementations of the present disclosure provide for the fabrication of high-density boron-carbon hardmask films at higher temperatures (e.g., 400 degrees Celsius). Implementations of the high-density boron-carbon hardmask films described herein have reduced in-film $H_2$ content and increased modulus compared to currently available low temperature boron-containing hardmask films, while maintaining lower stress, transparency and high deposition rates. The ultra-high etch selectivity of boron-carbon hardmask films described herein allow single-pass pattern transfer of high-aspect ratio features in future generations of NAND and DRAM devices. The boron-carbon hardmask films described herein are well suited for 7-10 nanometer devices due to their resistance to pattern collapse, excellent critical dimension ("CD") control and higher pattern resolution. Additionally, due to extreme etch selectivity to underlying layers; the boron-carbon hardmask films described herein are thinner (e.g., about 30% to 40% thinner for the same device dimensions) in comparison to current films, which would reduce deposition and stripping time. Implementations of the present disclosure, provide boron-carbon films having ultra-high modulus (≥200 GPa) and high etch selectivity (>4× improvement over current hardmask films).

Films can be deposited using various carbon precursors (e.g., propylene, acetylene, ethylene, methane, hexane, hexane, isoprene, butadiene etc.), boron sources (e.g., diborane ($B_2H_6$), orthocarborane and trimethylborazine); and nitrogen containing precursors (e.g., pyridine, aliphatic amine, amines, nitriles, ammonia). Based on the systematic analysis of different film deposition parameters including temperature (e.g., 400 to 700 degrees Celsius; 550 to 650 degrees Celsius), pressure (e.g., 2 to 20 Torr; 10 to 20 Torr), boron precursor flow rate (e.g., 100-6,000 sccm), $H_2$ dilution of the boron precursor (e.g., 2 to 20%), and RF power (e.g., 500 to 2,500 Watts) it was determined that at higher temperatures, the extinction coefficient (k) and stress are significantly higher than at low temperatures.

Higher k and stress adversely affect film composition, and are detrimental to photolithographic pattern transfer. At very high film stresses, residual stress caused the film to peel-off from the underlying layer or causes high particle defects. Similarly, the absorption/extinction coefficient of film strongly depends on temperature, and is driven by morphology and molecular structure amorphous carbon structure (i.e. $sp^2/sp^3$ binding) and boron incorporation. Hence, implementations described herein provide film deposition parameters ($B_2H_6$ flow, substrate to electrode spacing, RF power, chamber pressure, etc.) for depositing boron-carbon films that having <0.01 k and <+/−100 MPa stress.

Implementations described herein will be described below in reference to a PECVD process that can be carried out using any suitable thin film deposition system. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

The term "about" generally indicates within ±0.5% or up to 1% of the indicated value. In addition, the term "about" can indicate either a measurement error (i.e., by limitations in the measurement method), or alternatively, a variation or average in a physical characteristic of a group (e.g., a population of pores).

FIG. 1 depicts a schematic illustration of a substrate processing system 132 that can be used to perform amorphous carbon layer deposition in accordance with implementations described herein. The substrate processing system 132 includes a processing chamber 100 coupled to a gas panel 130 and a controller 110. The processing chamber 100 generally includes a top 124, a side 101 and a bottom wall 122 that define an interior processing volume 126. A support pedestal 150 for supporting a substrate 190 is positioned in the interior processing volume 126 of the processing chamber 100. The support pedestal 150 is supported by a stem 160 and may be typically fabricated from aluminum, ceramic, and other suitable materials. The support pedestal 150 may be moved in a vertical direction inside the processing chamber 100 using a displacement mechanism (not shown).

The support pedestal 150 may include an embedded heater element 170 suitable for controlling the temperature of the substrate 190 supported on a surface 192 of the support pedestal 150. The support pedestal 150 may be resistively heated by applying an electric current from a power supply 106 to the embedded heater element 170. The embedded heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the embedded heater element 170, thus maintaining the substrate 190 and the support pedestal 150 at a substantially constant temperature during film deposition. The supplied electric current may be adjusted to selectively control the temperature of the support pedestal 150 between about 400 degrees Celsius to about 700 degrees Celsius.

A temperature sensor 172, such as a thermocouple, may be embedded in the support pedestal 150 to monitor the temperature of the support pedestal 150 in a conventional manner. The measured temperature is used by the controller 110 to control the power supplied to the embedded heater element 170 to maintain the substrate 190 at a desired temperature.

A vacuum pump 102 is coupled to a port formed in the bottom of the processing chamber 100. The vacuum pump 102 is used to maintain a desired gas pressure in the processing chamber 100. The vacuum pump 102 also evacuates post-processing gases and by-products of the process from the processing chamber 100.

The substrate processing system 132 may further include additional equipment for controlling the chamber pressure, for example, valves (e.g. throttle valves and isolation valves) positioned between the processing chamber 100 and the vacuum pump 102 to control the chamber pressure.

A gas distribution assembly 120 having a plurality of apertures 128 is disposed on the top of the processing chamber 100 above the support pedestal 150. The apertures 128 of the gas distribution assembly 120 are utilized to introduce process gases into the processing chamber 100. The apertures 128 may have different sizes, number, distributions, shape, design, and diameters to facilitate the flow of the various process gases for different process requirements. The gas distribution assembly 120 is connected to the gas panel 130 that allows various gases to supply to the interior processing volume 126 during process. Plasma is formed from the process gas mixture exiting the gas distribution assembly 120 to enhance thermal decomposition of the process gases resulting in the deposition of material on a surface 191 of the substrate 190.

The gas distribution assembly 120 and support pedestal 150 may form a pair of spaced apart electrodes in the interior processing volume 126. One or more RF power sources 140 provide a bias potential through a matching network 138 to the gas distribution assembly 120 to facilitate generation of plasma between the gas distribution assembly 120 and the support pedestal 150. Alternatively, the RF power sources 140 and matching network 138 may be coupled to the gas distribution assembly 120, the support pedestal 150, or coupled to both the gas distribution assembly 120 and the support pedestal 150, or coupled to an antenna (not shown) disposed exterior to the processing chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc. In one implementation, the boron-carbon film may be deposited using a PRODUCER SE™ or PRODUCER GT™ processing chamber, which is commercially available from Applied Materials, Inc., Santa Clara, California using the parameters set forth in Table I below.

The quantity/percentage of boron in the as-deposited boron-carbon film may vary from application to application. The atomic percentage of boron incorporation in the film is calculated as follows: ((B/(B+C) %). In various implementations of the present disclosure, the boron-carbon film may contain at least 5, 8, 10, 15, 20, 25, 30, 35, 40, 45, 50, 55, 60, or 65 atomic percentage of boron. The boron-carbon film may contain up to 8, 10, 15, 20, 25, 30, 35, 40, 45, 50, 55, 60, 65, or 70 atomic percentage of boron. The boron-carbon film may contain from about 5 to about 70 atomic percentage of boron. The boron-carbon film may contain from about 30 to about 70 atomic percentage of boron. The boron-carbon film may contain from about 50 to about 60 atomic percentage of boron. The atomic percentage of carbon incorporation in the film is calculated as follows: ((C/(B+C) %). The boron-carbon film may contain at least 30, 35, 40, 45, 50, 55, 60, 65, 70, 75, 80, 85, or 90 atomic percentage of carbon. The boron-carbon film may contain up to 35, 40, 45, 50, 55, 60, 65, 70, 75, 80, 85, 90, or 95 atomic percentage of carbon. The boron-carbon film may contain from about 30 to about 95 atomic percentage of carbon. The boron-carbon film may contain from about 30 to about 70 atomic percentage of carbon. The boron-carbon film may contain from about 35 to about 50 atomic percentage of carbon. The boron-carbon film may contain at least 10, 15, or 20 atomic percentage of hydrogen. The boron-carbon film may contain up to 15, 20, or 25 atomic percentage of hydrogen. The boron-carbon film may contain from about 10 to about 25 atomic percentage of hydrogen. The boron-carbon film may contain from about 15 to about 20 atomic percentage of hydrogen. In certain implementations where nitrogen is used as a precursor, the boron-carbon film may contain at least 2, 5, 8, 10, or 15 atomic percentage of nitrogen. The boron-carbon film may contain up to 5, 8, 10, 15 or 20 atomic percentage of nitrogen. The boron-carbon film may contain from about 2 to about 15 atomic percentage of nitrogen. The boron-carbon film may contain from about 5 to about 10 atomic percentage of nitrogen.

In general, the following exemplary deposition process parameters may be used to form the boron-containing amorphous carbon layer. The process parameters may range from a wafer temperature of about 400 degrees Celsius to about 700 degrees Celsius (e.g., between about 500 degrees Celsius to about 700 degrees Celsius; between about 550 degrees Celsius to about 650 degrees Celsius). The chamber pressure may range from a chamber pressure of about 1 Torr to about 20 Torr (e.g., between about 2 Torr and about 15 Torr; between about 12 Torr and about 15 Torr). The flow rate of the hydrocarbon-containing gas may be from about 200 sccm to about 5,000 sccm (e.g., between about 200 sccm and about 2,000 sccm; between about 500 sccm and about 700 sccm). The flow rate of a dilution gas may individually range from about 0 sccm to about 5,000 sccm (from about 3,000 sccm to about 5,000 sccm; from about 3,500 sccm to about 4,500 sccm). The flow rate of an inert gas may individually range from about 0 sccm to about 10,000 sccm (e.g., from about 200 sccm to about 2,000 sccm; from about 400 sccm to about 500 sccm). The flow rate of the boron-containing gas mixture may be from about 100 sccm to about 15,000 sccm (e.g., between about 200 sccm and about 6,000 sccm; between about 4,000 sccm and about 5,000 sccm). The RF power may be between 1,000 Watts and 3,000 Watts. The RF power may be between about 1 W/in² and about 100 W/in² (e.g., between about 3 W/in² and about 20 W/in². The plate spacing between the top surface 191 of the substrate 190 and the gas distribution assembly 120 may be between about 200 mils to about 1000 mils (e.g., between about 200 mils to about 600 mils; between about 300 mils to about 400 mils). The boron-carbon film may be deposited to a thickness between about 100 Å and about 30,000 Å. The boron-carbon film may be deposited to a thickness between about 1,000 Å and about 18,000 Å. The boron-carbon film may be deposited to a thickness between about 100 Å and about 20,000 Å, such as between about 300 Å to about 5000 Å. The above process parameters provide a typical deposition rate for the boron-containing amorphous carbon layer in the range of about 100 Å/min to about 10,000 Å/min and can be implemented on a 300 mm substrate in a deposition chamber available from Applied Materials, Inc. of Santa Clara, CA.

TABLE I

| Deposition Parameter | Exemplary Range | Exemplary Range | |
|---|---|---|---|
| Temperature (° C.) | 400-700° C. | 500-700° C. | 550-650° C. |
| Pressure (Torr) | 1-20.0 Torr | 2-15 Torr | 8-15 Torr |
| RF Power (13.56 MHz) | 100-3,000 Watts | 1,000-3,000 Watts | 2,100 Watts |
| Spacing | 200-1,000 mils | 200-600 mils | 320 mils |
| $C_3H_6$ flow | 200-5,000 sccm | 200-2,000 sccm | 500 sccm |
| He flow | 0-10,000 sccm | 200-2,000 sccm | 400 sccm |
| $H_2$ flow | 0-5,000 sccm | 3,000-5,000 sccm | 500-4,500 sccm |
| $B_2H_6$ mixture flow | 1,000-15,000 sccm | 200-6,000 sccm | 4,000 sccm |
| Ar flow | 0-10,000 sccm | 5,000-7,000 sccm | 7,000 sccm |

The as-deposited boron-carbon film may have a refractive index (n) (633 nm)) of greater than 2.5, for example approximately 2.7 (e.g., from about 2.5 to about 3.0). The as-deposited boron-carbon film may have a k value (k (at 633 nm)) of less than 0.1, for example, (e.g., from about 0.01 to about 0.09; from about 0.04 to about 0.06; approximately 0.06 or less). The as-deposited boron-carbon film may have an elastic modulus (GPa) of from about 200 to about 400 GPa (e.g., from about 200 to about 350 GPa; from about 210 to about 320 GPa; about 212 GPa). The as-deposited boron-carbon film may have a stress (MPa) of from about-200 MPa to about 200 MPa (e.g., from about-150 MPa to about 150 MPa; from about-100 MPa to about 100 MPa). The as-deposited boron-carbon film may have a density (g/cc) of greater than 1.5 g/cc, for example approximately 1.9 g/cc or higher such as 2.0 g/cc (e.g., from about 1.5 g/cc to about 2.5 g/cc; from about 1.5 g/cc to about 2.0 g/cc).

Figure 2:
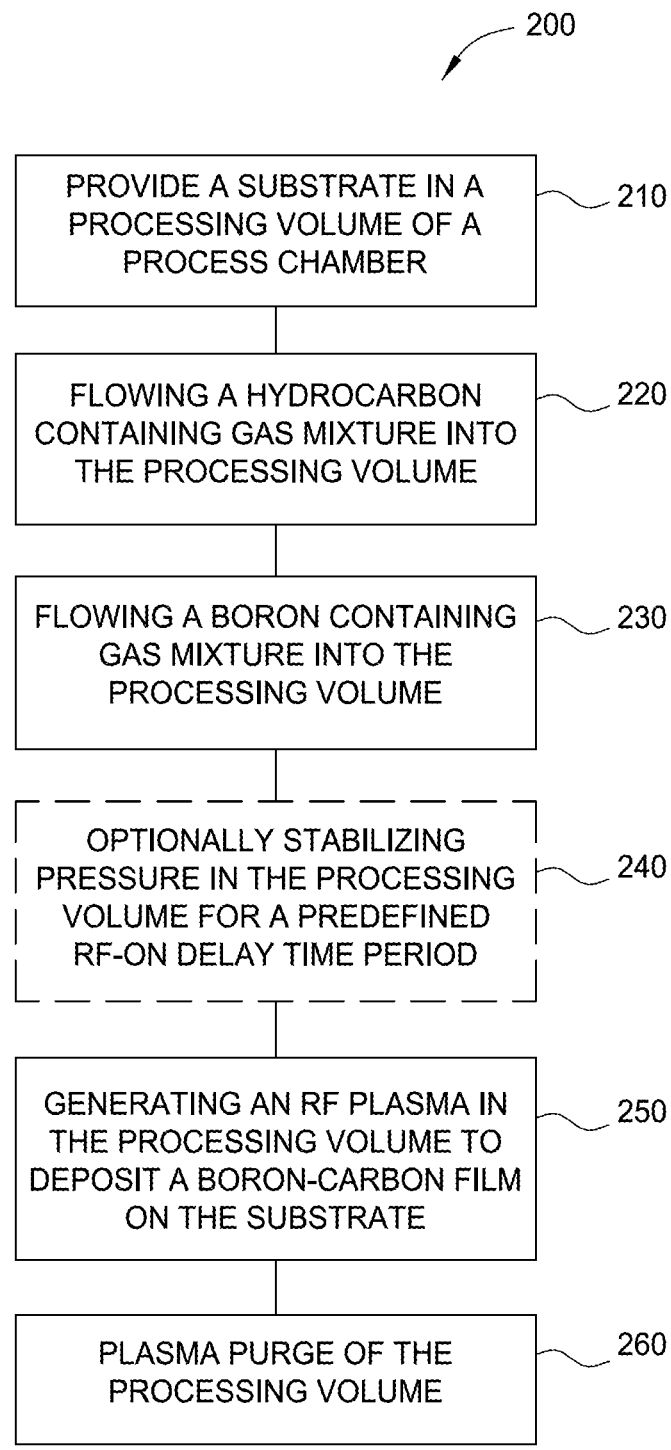
FIG. 2 depicts a process flow diagram depicting one implementation of a method for depositing a boron-carbon film according to implementations described herein.
Figure 3:
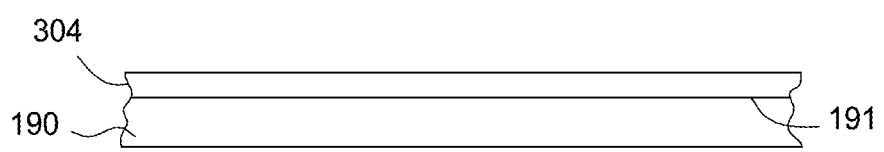
FIG. 3 depicts a schematic cross-sectional view of a substrate structure incorporating a boron-carbon film as a hardmask layer according to implementations described herein.

FIG. 2 is a process flow diagram depicting one implementation of a method 200 for depositing a boron-carbon film according to implementations described herein. The method 200 begins at operation 210 by providing a substrate in a processing volume of a processing chamber. The processing chamber may be the processing chamber 100 depicted in FIG. 1. The substrate may be substrate 190, also depicted in FIG. 1. The surface 191 of the substrate 190, as shown in FIG. 3, is substantially planar. Alternatively, the substrate 190 may have patterned structures, for example, a surface having trenches, holes, or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application. In one implementation where a memory application is desired, the substrate 190 may include the silicon substrate material, an oxide material, and a nitride material, with or without polysilicon sandwiched in between.

In another implementation, the substrate 190 may include a plurality of alternating oxide and nitride materials (i.e., oxide-nitride-oxide (ONO)) (not shown) deposited on the surface 191 of the substrate 190. In various implementations, the substrate 190 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate 190 may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

At operation 220, a hydrocarbon-containing gas mixture is flowed into the interior processing volume 126. The hydrocarbon-containing gas mixture may be flowed from the gas panel 130 into the interior processing volume 126 through the gas distribution assembly 120. The gas mixture may include at least one hydrocarbon compound. The gas mixture may further include an inert gas, a dilution gas, a nitrogen-containing gas, or combinations thereof. The hydrocarbon can be any liquid or gas, though the preferred precursor would be vapor at room temperature to simplify the hardware needed for material metering, control and delivery to the chamber.

In one implementation, the carbon source is a gaseous hydrocarbon, such as a linear hydrocarbon. In one implementation, the hydrocarbon compound has a general formula $C_xH_y$, where x has a range of between 1 and 20 and y has a range of between 1 and 20. In one implementation, the hydrocarbon compound is an alkane. Suitable hydrocarbon compounds include, for example, alkanes such as methane ($CH_4$), ethane ($C_2H_6$), propylene ($C_3H_6$), propane ($C_3H_8$), butane ($C_4H_{10}$) and its isomer isobutane, pentane ($C_5H_{12}$), hexane ($C_6H_{14}$) and its isomers isopentane and neopentane, hexane ($C_6H_{14}$) and its isomers 2-methylpentane, 3-methylpentane, 2,3-dimethylbutane, and 2,2-dimethyl butane, or combinations thereof. Additional suitable hydrocarbons include, for example, alkenes such as acetylene, ethylene, propylene, butylene and its isomers, pentene and its isomers, and the like, dienes such as butadiene, isoprene, pentadiene, hexadiene, or combinations thereof. Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or combinations thereof. Additional suitable hydrocarbons include, for example, alkynes such as acetylene ($C_2H_2$), propyne ($C_3H_4$), butylene ($C_4H_8$), vinylacetylene, or combinations thereof. Additional suitable hydrocarbons include, for example, aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or combinations thereof. In one example, $C_3H_6$ is preferable due to formation of more stable intermediate species which allows more surface mobility.

Suitable dilution gases such as helium (He), argon (Ar), hydrogen ($H_2$), nitrogen ($N_2$), ammonia ($NH_3$), or combinations thereof, among others, may be added to the gas mixture, if desired. Ar, He, and $N_2$ are used to control the density and deposition rate of the amorphous carbon layer. In some cases, the addition of $N_2$ and/or $NH_3$ can be used to control the hydrogen ratio of the amorphous carbon layer, as discussed below. Alternatively, dilution gases may not be used during the deposition.

A nitrogen-containing gas may be supplied with the hydrocarbon-containing gas mixture into the processing chamber 100. Suitable nitrogen-containing compounds include, for example, pyridine, aliphatic amine, amines, nitriles, ammonia and similar compounds.

An inert gas, such as argon (Ar) and/or helium (He) may be supplied with the hydrocarbon-containing gas mixture into the processing chamber 100. Other inert gases, such as nitrogen ($N_2$) and nitric oxide (NO), may also be used to control the density and deposition rate of the amorphous carbon layer. Additionally, a variety of other processing gases may be added to the gas mixture to modify properties of the amorphous carbon material. In one implementation, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., carbon to hydrogen ratio) of the deposited amorphous carbon layer. The hydrogen ratio present in the amorphous carbon film provides control over layer properties, such as reflectivity.

At operation 230, a boron-containing gas mixture is flowed into the interior processing volume 126. The boron-containing gas mixture may be flowed from the gas panel 130 into the interior processing volume 126 through the gas distribution assembly 120. In one implementation, the boron-containing gas mixture comprises a boron-containing compound and an inert gas. Examples of boron-containing compounds include diborane ($B_2H_6$), trimethyl boron (TMB or $B(CH_3)_3$), triethylboron (TEB), methyl boron, dimethyl boron, ethyl boron, diethyl boron, ortho-carborane ($C_2B_{10}H_{12}$) and similar compounds.

In one implementation, the percentage of boron-containing compound in the total boron-containing gas mixture is from about 2% to about 25% (e.g., from about 10% to about 20%; from about 15% to about 20%; from about 2% to about 15%; or from about 4% to about 12%). Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, 5% $B_2H_6$/95% H2 or 20% $B_2H_6$/80% $H_2$. It is contemplated that when different concentrations of boron-containing gas mixtures are used, the flow rate needed to achieve certain film properties may change accordingly. For example in implementations where 5% diborane is used as the boron-containing gas source, the flow rate of the boron-containing gas mixture may be from about 5,000 sccm to about 15,000 sccm, for example, about 13,000 sccm. In another implementation where 10.5% diborane is used as the boron-containing gas source, the flow rate of the boron-containing gas mixture may be from about 4,000 sccm to about 10,000 sccm, for example about 6,000 sccm to about 7,000 sccm. In another implementation where 20% diborane is used as the boron-containing gas source, the flow rate of the boron-containing gas mixture may be from about 100 sccm to about 6,000 sccm, for example about 4,000 sccm to about 6,000 sccm.

FIG. 2 shows one implementation where the hydrocarbon-containing gas mixture and the boron-containing gas mixture are introduced into the interior processing volume 126 before turning on the RF plasma in operation 250. In such an implementation, the hydrocarbon-containing gas mixture may be introduced into the interior processing volume 126 for a longer time such as between about 5 seconds and about 30 seconds, for example about 15 seconds, which may vary depending upon the size of the substrate. The flowing of the hydrocarbon-containing gas mixture prior to the introduction of the boron-containing gas is believed to provide continuous thermal and pressure stabilization of the interior processing volume 126. The boron-containing gas mixture is then flowing into the interior processing volume 126 about 0.5 seconds to about 5 seconds, for example about 1 seconds to about 2 seconds (the flowing time may vary as long as the flow is just long enough for the boron-containing gas mixture to start reaching the interior processing volume 126) prior to striking the RF plasma in operation 250. The process of operation 230 may be performed simultaneously, sequentially or may partially overlap with the processes of operation 220.

Optionally, at operation 240, the pressure in the processing volume is stabilized for a predefined RF-on delay time period. The predefined RF-on delay time period is a fixed time delay defined as the time period between introduction of the boron-containing gas mixture into the processing volume and striking or generating the plasma in operation 250. Any suitable fixed time delay may be used to achieve desired conditions. The length of the RF-on delay time period is typically selected such that the boron-containing gas mixture does not begin to thermally decompose or substantially thermally decompose in the processing volume. The process of operation 240 may be performed simultaneously, sequentially or may partially overlap with the processes of operation 220 and operation 230.

At operation 250, after the predefined RF-on delay time period of operation 240 expires, RF plasma is generated in the interior processing volume 126 to deposit a boron-carbon film 304 on the substrate 190. The plasma may be formed by capacitive or inductive means, and may be energized by coupling RF power into the precursor gas mixture. The RF power may be a dual-frequency RF power that has a high frequency component and a low frequency component. The RF power is typically applied at a power level between about 50 W and about 2,500 W, which may be all high-frequency RF power, for example at a frequency of about 13.56 MHz, or may be a mixture of high-frequency power and low frequency power, for example at a frequency of about 300 kHz. The flow of hydrocarbon-containing gas mixture and the boron-containing gas mixture may continue until a desired thickness of the boron-carbon film 304 is reached.

The thickness of the boron-carbon film 304 is variable depending upon the stage of processing. In one implementation, the boron-carbon film may be deposited to a thickness between about 100 Å and about 30,000 Å (e.g., from about 1,000 Å to about 18,000 Å; from about 100 Å to about 20,000 Å; from about 300 Å to about 5,000 Å; or from about 1,000 Å to about 2,000 Å.) Optionally, at operation 260, a plasma purge of the processing volume is performed. A purge gas can flow from a purge gas source into the processing chamber 100. The gas distribution assembly 120 and support pedestal 150 are energized generating a purge gas plasma. Purge gases which can be used in the processing chamber 100 including $NH_3$, $N_2$, $N_2O$, $H_3$, Ar, He and other suitable plasma purge gases. During the purge process, the heat and pressure can be maintained in the processing chamber 100. The plasma purge conditions the surface of the exposed layer for additional depositions. The conditioned surface results in a smooth interface between layers and better adhesion between layers, as well as better particle control. In some embodiments, a rougher interface may be desirable for better layer bonding and a different or additional plasma purge process may be performed. After the plasma purge is completed, the energy to the gas distribution assembly 120 and the support pedestal 150 can be turned off and a gas purge from a gas purge source flows into the processing chamber 100 to remove all gas contaminants. In one implementation, one or more components of the precursor gas are stopped during the purge process. For example, if the process gas includes a mixture of diborane, propylene and He, the purge gas can only include He and the flow of diborane and propylene is shut-off. In other implementations, a different purge gas or purge gases can be used.

Additional processing of the substrate 190 may be performed after the process of operation 260.

The boron-carbon film 304 may be patterned using a standard photoresist patterning techniques. A patterned photoresist (not shown) may be formed over the boron-carbon film 304. The boron-carbon film 304 may be etched in a pattern corresponding with the patterned photoresist layer followed by etching the pattern into the substrate 190. Material may be deposited into the etched portions of the boron-carbon film 304. The boron-carbon film 304 may be removed using a solution comprising hydrogen peroxide and sulfuric acid. One exemplary solution comprising hydrogen peroxide and sulfuric acid is known as Piranha solution or Piranha etch. The boron-carbon film 304 may also be removed using etch chemistries containing oxygen and halogens (e.g. fluorine or chlorine), for example, $Cl_2/O_2$, $CF_4/O_2$, $Cl_2/O_2/CF_4$. The boron-carbon film 304 may be removed by a chemical mechanical polishing (CMP) process.

The flowing the hydrocarbon-containing gas mixture into the processing volume (operation 220), the flowing a boron-containing gas mixture into the processing volume (operation 230), optionally stabilizing the pressure in the processing volume (operation 240) and the generating the RF plasma in the processing volume to deposit the boron-carbon film (operation 250) may be repeated until a predetermined thickness is achieved.

Examples

The following non-limiting examples are provided to further illustrate implementations described herein. However, the examples are not intended to be all inclusive and are not intended to limit the scope of the implementations described herein. Plasma CVD assisted deposition of various Boron, Nitrogen and Carbon containing films were tested and evaluated for their optical properties (n/k/thickness), mechanical properties (stress/modulus/hardness/strain-energy), etch selectivity and compositional/morphological behaviors (B, H, C contents). Based on the systematic analysis of different film deposition parameters including temperature, pressure, boron precursor flow rate, H2 dilution of the boron precursor, and RF power it was determined that at high temperatures, the extinction coefficient (k) and stress of boron-carbon films was significantly higher than at low temperatures.

Table 1 depicts boron-carbon film properties for an amorphous carbon film (APF) reference and a boron-carbon film formed using know techniques in comparison with the properties of a high etch selectivity boron-carbon film formed according to implementations described herein. The percentage of boron incorporation in the films is calculated as follows: ((B/(B+C) %).

TABLE I

| Item | Amorphous Carbon Film Reference | Boron-Carbon film | Proposed High Etch Selectivity Boron-Carbon film | |
|---|---|---|---|---|
| | | | 550° C. | 650° C. |
| Blanket - Oxide Etch Selectivity | 1× | 2.5× | 3.7× | 4.7× |
| Blanket - Si/W Etch Selectivity | 1× | 0.8× | 1× | 1.1× |
| Density (g/cc) | 1.5 | 1.7 | 1.9 | 2.0 |
| Stress (MPa) | +50 | ~−53 | −75 | −131 |
| Deposition rate (Å/min) | ~4000 | 4716 | 4346 | 4126 |
| 633 nm n/633 nm k | ~2.2/0.4 | 2.22/0.03 | 2.5/0.04 | 2.7/0.06 |
| Elastic Modulus (GPa) | ~50 | 97 | 212 | 319 |
| Boron % (XRF) | n.a. | 61% | 60% | 59% |
| Hydrogen % (RBS) | 12% | 36% | 22% | 15% |

Figure 4A:
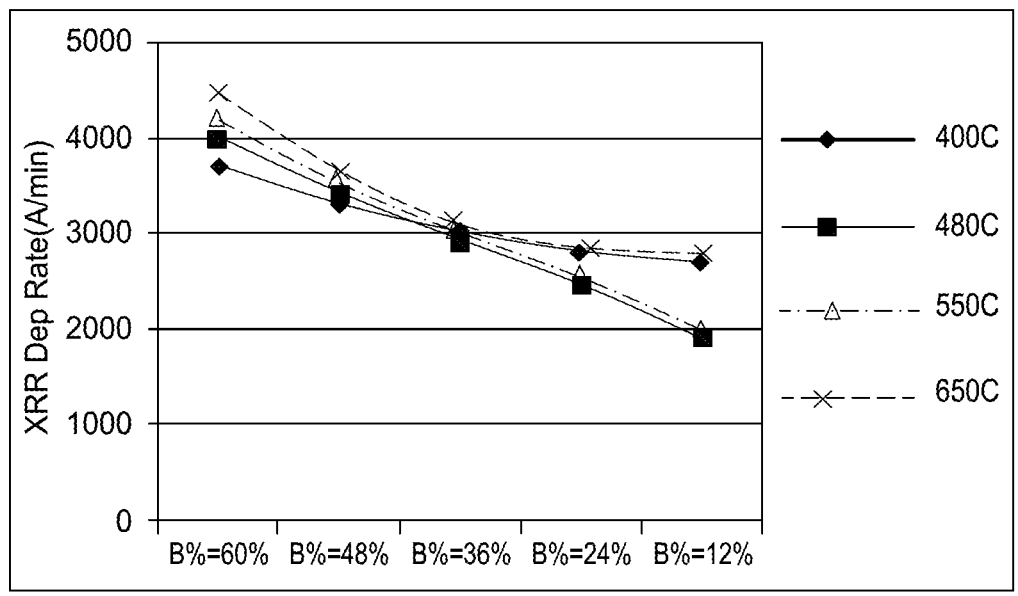
FIG. 4A is a plot illustrating the effect of temperature and boron incorporation on the deposition rate of boron-carbon films according to implementations described herein.

FIG. 4A is a plot illustrating the effect of temperature (400° C., 480° C., 550° C., 650° C.) and boron incorporation (12%, 24%, 36%, 48%, 60%) on the deposition rate of boron-carbon films according to implementations described herein. The y-axis represents the deposition rate (Å/minute). The x-axis represents the percentage of boron in the final boron-carbon film. As illustrated in FIG. 4A, as the flow rate of diborane increases, the deposition rate of the boron-carbon film also increases.

Figure 4B:
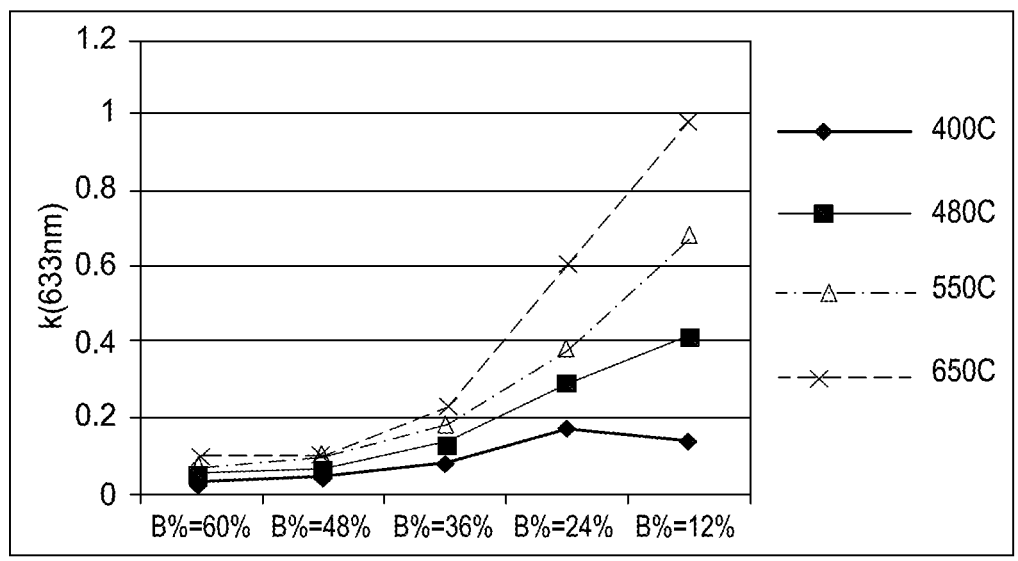
FIG. 4B is a plot illustrating the effect of temperature and boron incorporation on the optical properties of boron-carbon films according to implementations described herein.

FIG. 4B is a plot illustrating the effect of temperature (400° C., 480° C., 550° C., 650° C.) and boron incorporation (12%, 24%, 36%, 48%, 60%) on the extinction coefficient (k) of boron-carbon films according to implementations described herein. The y-axis represents the extinction coefficient (k). The x-axis represents the percentage of boron in the final boron-carbon film. As illustrated in FIG. 4B, as the flow rate of diborane increases, the extinction coefficient (k) of the boron-carbon film decreases. As further illustrated in FIG. 4B, as the temperature increases, the extinction coefficient (k) of the boron-carbon film increases.

Figure 4C:
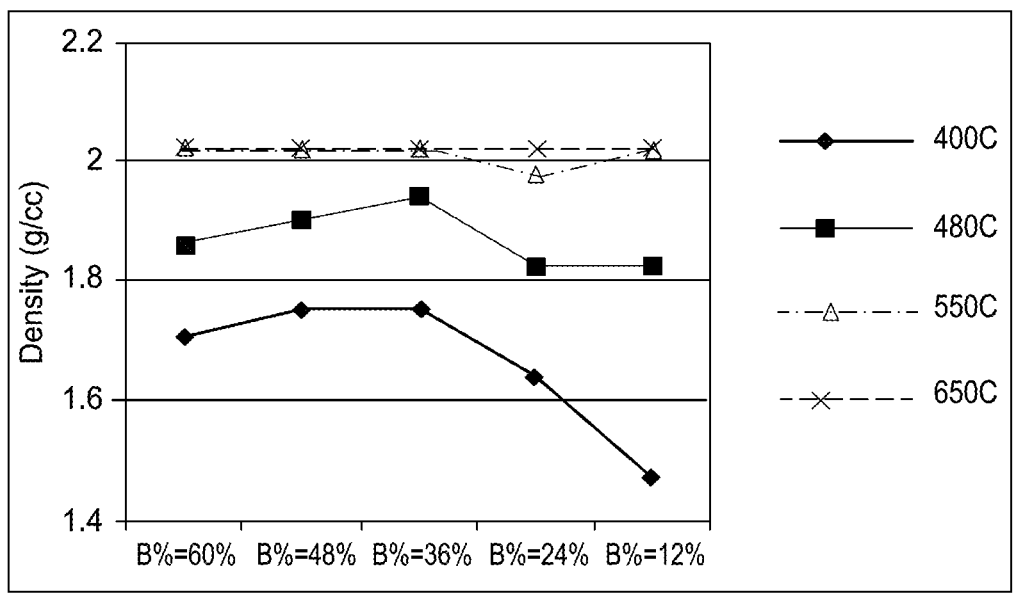
FIG. 4C is a plot illustrating the effect of temperature and boron incorporation on the film density of boron-carbon films according to implementations described herein.

FIG. 4C is a plot illustrating the effect of temperature (400° C., 480° C., 550° C., 650° C.) and boron incorporation (12%, 24%, 36%, 48%, 60%) on the film density (g/cc) of boron-carbon films according to implementations described herein. As illustrated in FIG. 4C, as the flow rate of diborane increases, the density of the boron-carbon film generally remains constant. As further illustrated in FIG. 4C, as the temperature increases, the density of the boron-carbon film increases.

Figure 4D:
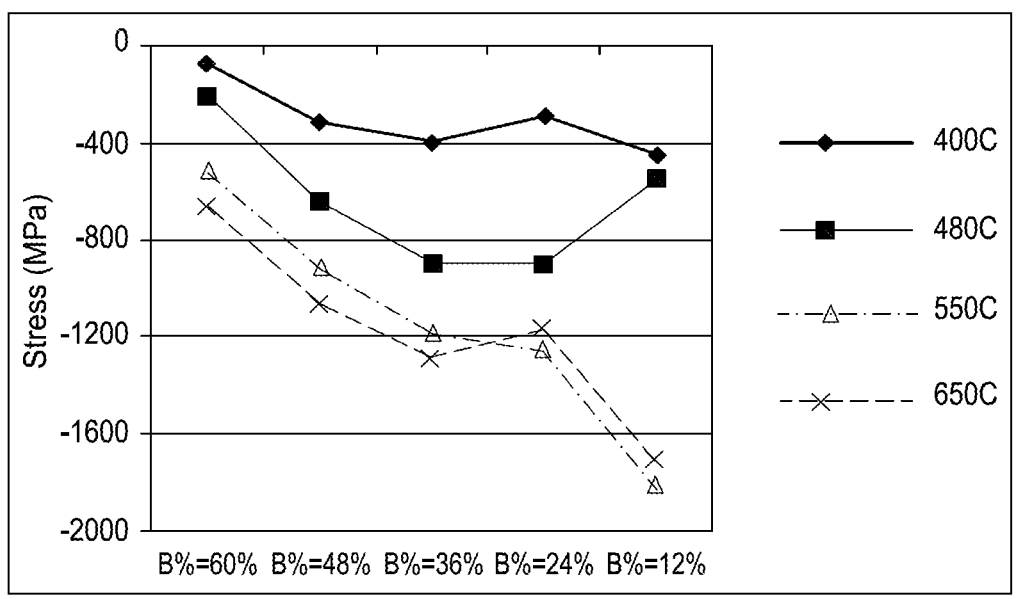
FIG. 4D is a plot illustrating the effect of temperature and boron incorporation on the stress of boron-carbon films according to implementations described herein.

FIG. 4D is a plot illustrating the effect of temperature (400° C., 480° C., 550° C., 650° C.) and boron incorporation (12%, 24%, 36%, 48%, 60%) on the stress (MPa) of boron-carbon films according to implementations described herein. As illustrated in FIG. 4D, as the flow rate of diborane increases, the stress (MPa) of the boron-carbon film decreases. As further illustrated in FIG. 4D, as the temperature increases, the stress of the boron-carbon film increases.

Figure 5B:
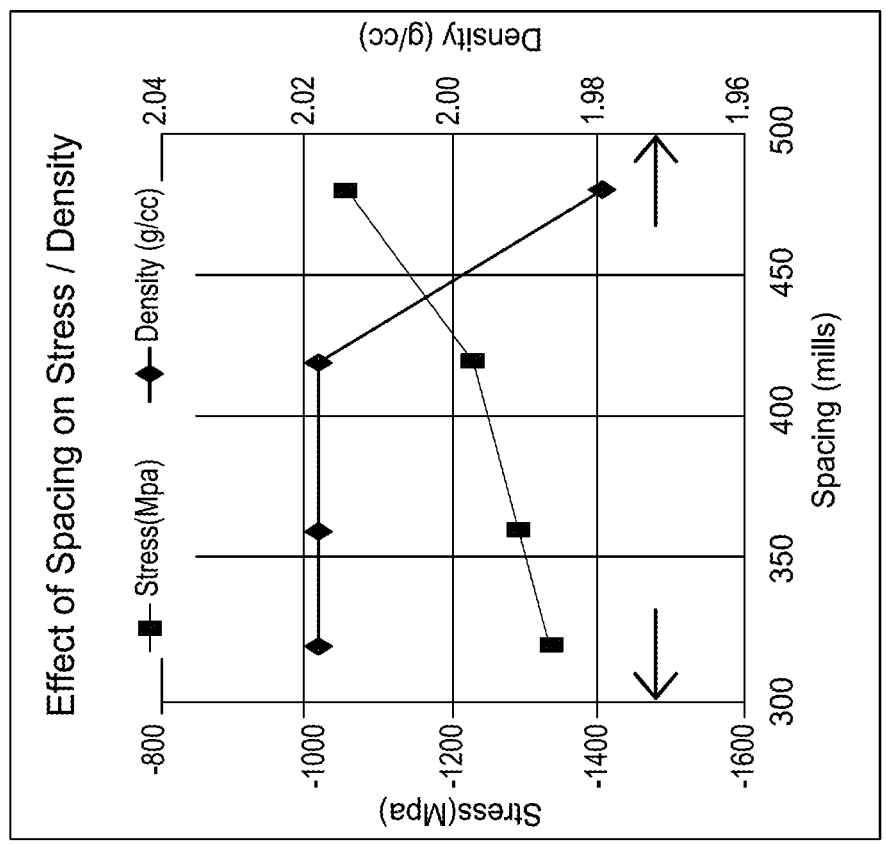
FIG. 5B is a plot illustrating the effect of spacing on the stress and film density of boron-carbon films according to implementations described herein.
Figure 5A:
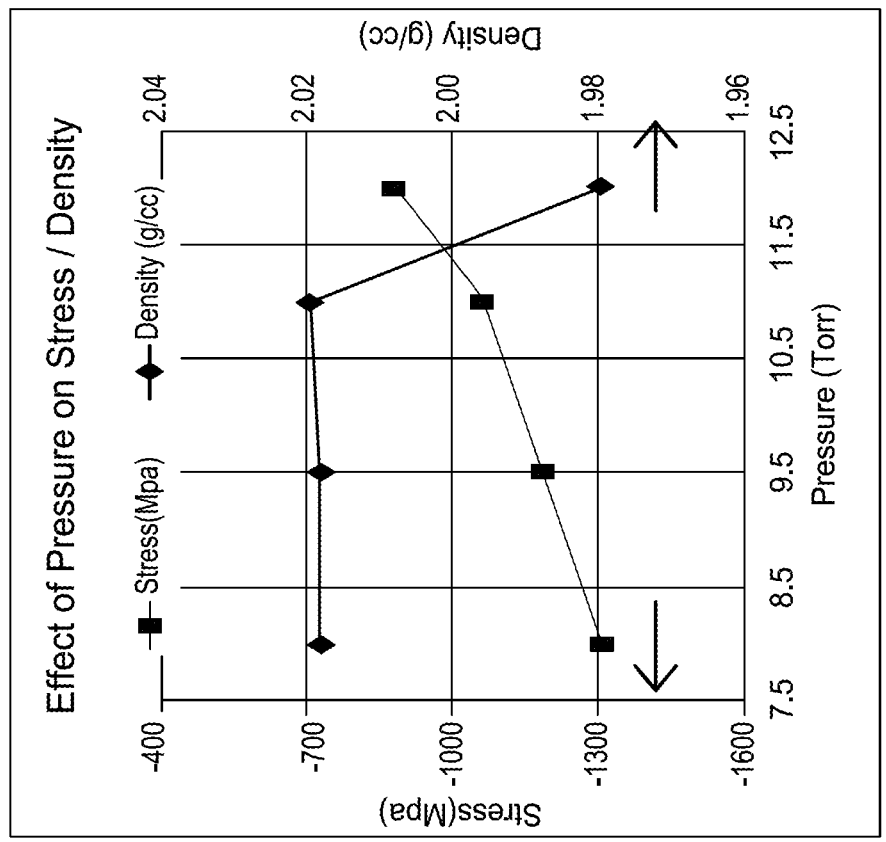
FIG. 5A is a plot illustrating the effect of pressure on the stress and film density of boron-carbon films according to implementations described herein.

FIG. 5A is a plot illustrating the effect of pressure on the stress and film density of boron-carbon films according to implementations described herein. FIG. 5B is a plot illustrating the effect of spacing on the stress and film density of boron-carbon films according to implementations described herein. FIG. 5A and FIG. 5B illustrate the use of pressure and spacing to modulate the stress/density of the boron-carbon film. Based on the finding in FIG. 5A and FIG. 5B a stress of less than −100 MPa was targeted at different processing temperatures.

Figure 6:
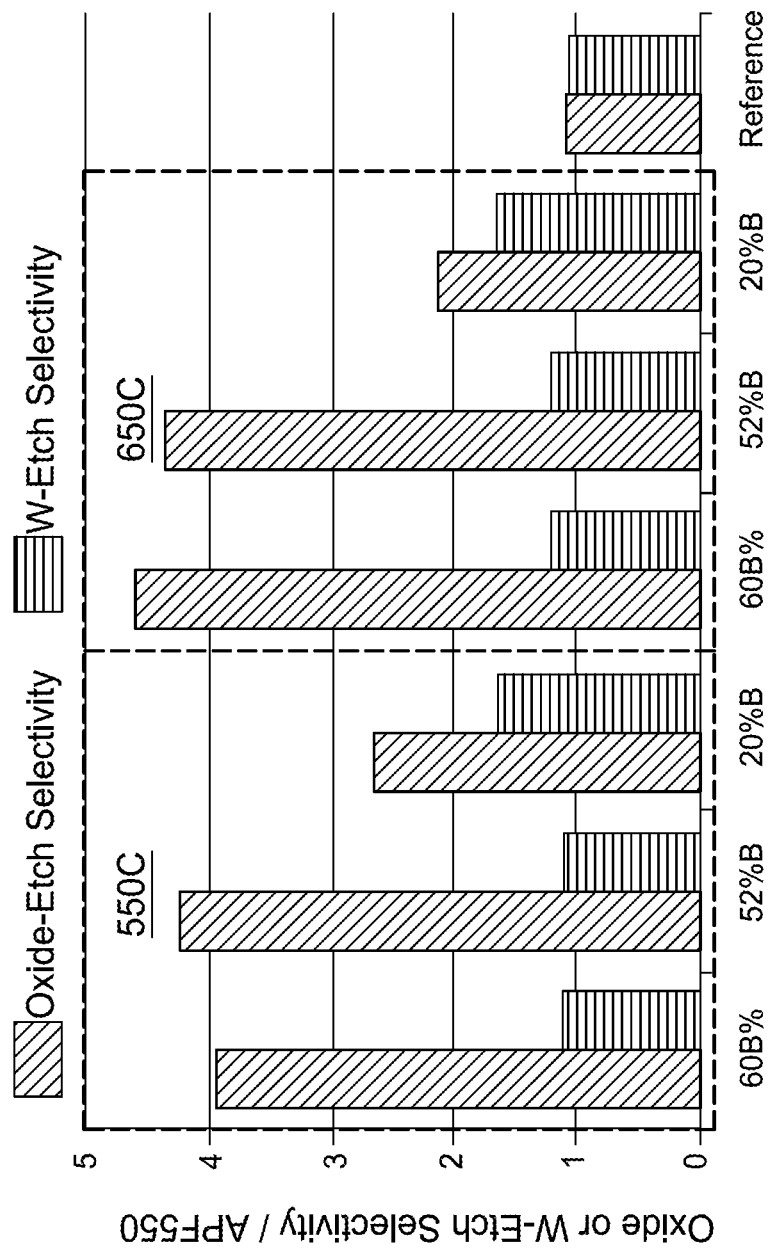
FIG. 6 is a bar graph illustrating the effect of boron percent on oxide etch selectivity and tungsten etch selectivity for boron-carbon films according to implementations described herein.

FIG. 6 is a bar graph illustrating the effect of boron percent (60%, 52%, and 20%) on oxide etch selectivity and tungsten etch selectivity (oxide or tungsten) at temperatures of 550 degrees Celsius and 650 degrees Celsius. As illustrated in FIG. 6, etch selectivity increases with temperature but so does stress for similar deposition conditions. As further illustrated in FIG. 6, as boron percent decreases, tungsten-etch selectivity increases but oxide etch selectivity drops.

Figure 7A:
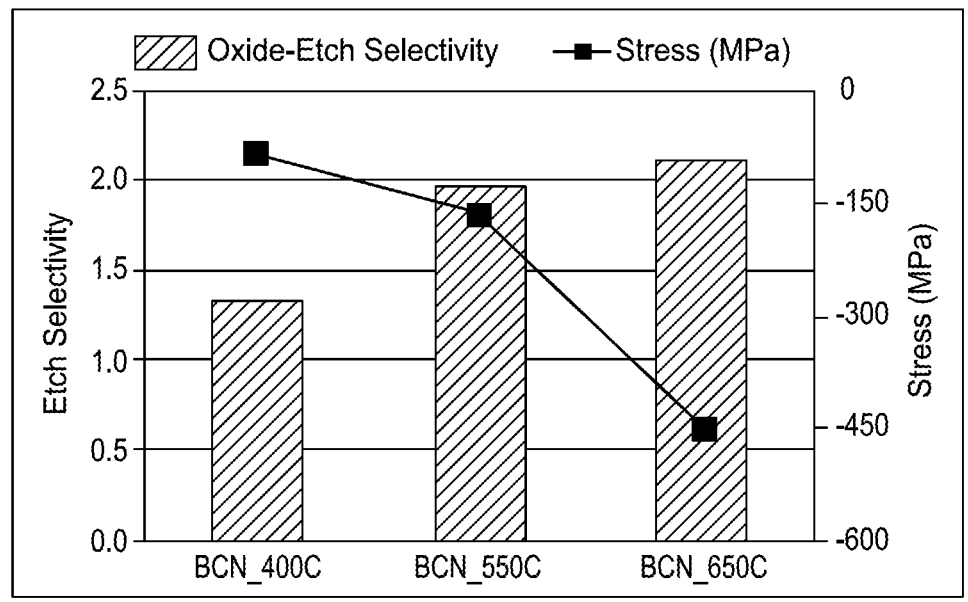
FIG. 7A is a bar graph illustrating the effect of temperature on the oxide etch selectivity and stress of boron-carbon films according to implementations described herein.
Figure 7B:
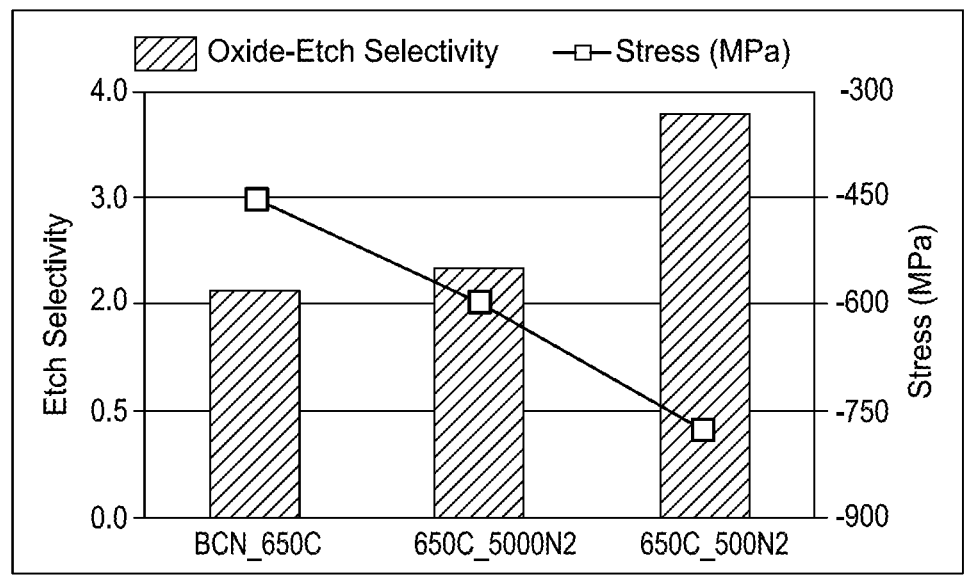
FIG. 7B is a bar graph illustrating the effect of nitrogen flow rate on the oxide etch selectivity and stress of boron-carbon films according to implementations described herein.
Figure 7C:
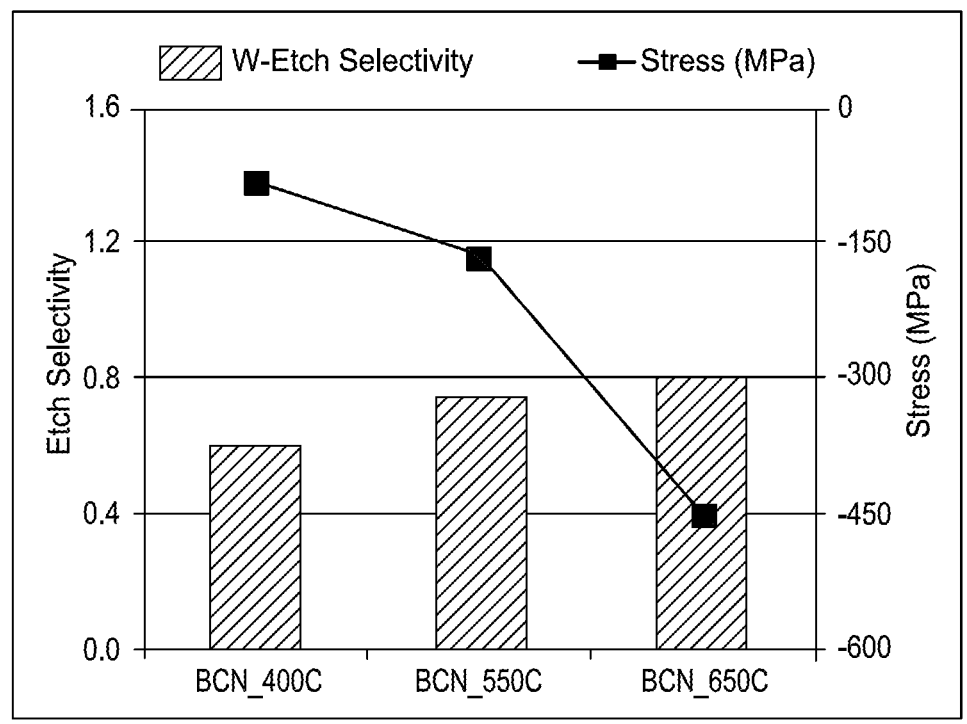
FIG. 7C is a bar graph illustrating the effect of temperature on the tungsten/silicon etch selectivity and stress of boron-carbon films according to implementations described herein.
Figure 7D:
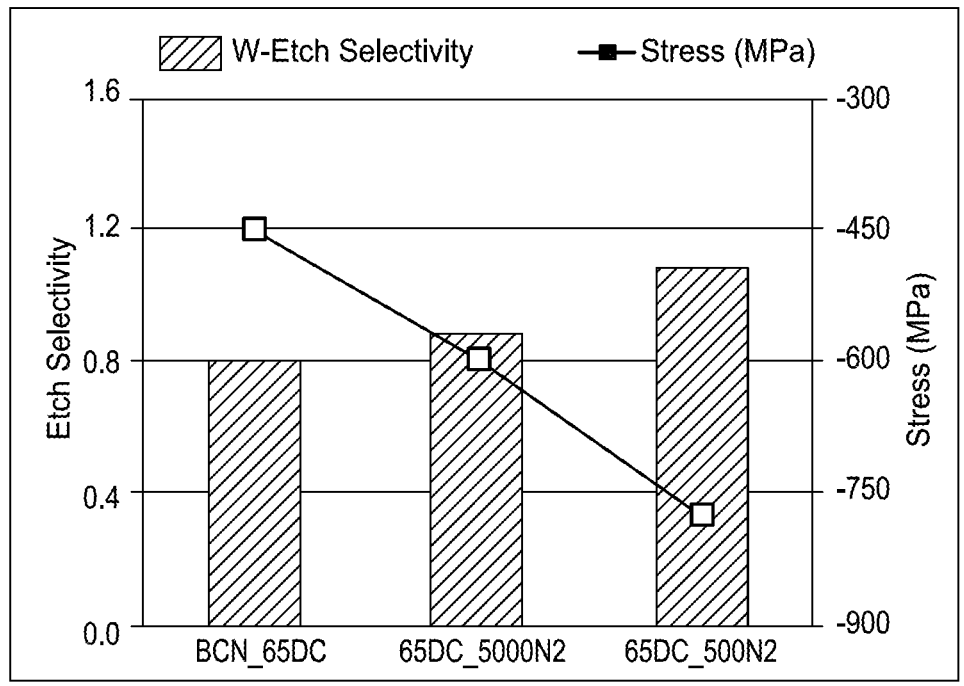
FIG. 7D is a bar graph illustrating the effect of nitrogen flow rate on the tungsten/silicon etch selectivity and stress of boron-carbon films according to implementations described herein.

FIG. 7A is a bar graph illustrating the effect of temperature on the oxide etch selectivity and stress of boron-carbon films according to implementations described herein. FIG. 7B is a bar graph illustrating the effect of nitrogen flow rate on the oxide etch selectivity and stress of boron-carbon films according to implementations described herein. FIG. 7C is a bar graph illustrating the effect of temperature on the tungsten/silicon etch selectivity and stress of boron-carbon films according to implementations described herein. FIG. 7D is a bar graph illustrating the effect of nitrogen flow rate on the tungsten/silicon etch selectivity and stress of boron-carbon films according to implementations described herein. In an approach to modulate stress and improve W/Si-Etch selectivity, nitrogen-rich Boron-Carbon-Nitride (BCN) hardmask films were evaluated. Nitrogen ($N_2$) incorporation was achieved by using different flow rates of $N_2$ gas in tandem with carbon and boron precursors. A significant increase in deposition rate was achieved by introducing nitrogen ($N_2$) into the gaseous deposition mixture. However, nitrogen based byproducts have higher volatility, and hence incorporation of N % is less than 5% in the final boron-carbon film. Therefore, etch selectivity improvements could not be realized. Based on FTIR results we observed that B-C peaks shifts towards C=C or C—N peaks, which should enhance W/Si selectivity. However, lower nitrogen incorporation and higher deposition rates results in breakdown of B-C matrix (amorphous morphology), reducing etch selectivity for both oxide and W/Si conditions.

While the foregoing is directed to implementations of the present disclosure, other and further implementation of the disclosure may be devised without departing from the basic scope thereof, and the scope thereof is determined by the claims that follow.

The invention claimed is:

1. A method of processing a substrate in a processing chamber, comprising:
exposing the substrate to a boron-containing gas mixture, a hydrocarbon-containing gas mixture, and a nitrogen-containing gas in the presence of RF power to deposit a boron-carbon amorphous film over the substrate, wherein the substrate is heated to a substrate temperature from about 400 degrees Celsius to about 700 degrees Celsius, and the boron-carbon amorphous film comprises at least 65 atomic percentage of boron, and at least 2 atomic percentage of nitrogen and less than 5 atomic percentage of nitrogen.

2. The method of claim 1, wherein the boron-carbon amorphous film has an elastic modulus (GPa) from about 200 GPa to about 400 GPa.

3. The method of claim 1, wherein the boron-carbon amorphous film has a stress from about −100 MPa to about 100 MPa.

4. The method of claim 1, wherein the boron-carbon amorphous film is deposited by exposing the substrate to a boron-containing gas mixture comprising diborane (B2H6) and a hydrocarbon-containing gas mixture comprising propylene (C3H6).

5. The method of claim 1, wherein the nitrogen-containing gas comprises pyridine, aliphatic amine, amines, nitriles, or ammonia.

6. The method of claim 1, wherein, prior to the exposing the substrate to the boron-containing gas mixture, the hydrocarbon-containing gas mixture, and the nitrogen-containing gas in the presence of RF power, the method further comprises stabilizing a pressure in the processing chamber for a predefined RF-on delay time period.

7. The method of claim 6, wherein the predefined RF-on delay time period is between about 0.1 seconds and 5 seconds.

8. A method of processing a substrate in a processing chamber, comprising:
exposing the substrate to a boron-containing gas mixture comprising diborane (B2H6), a hydrogen-containing gas, and a nitrogen-containing gas in the presence of a mixture of high-frequency RF power delivered at 13.56 MHz and low-frequency RF power delivered at 300 kHz to deposit a boron-carbon amorphous film over the substrate, wherein the boron-carbon amorphous film comprises at least 65 atomic percentage of boron, and at least 2 atomic percentage of nitrogen and less than 5 atomic percentage of nitrogen.

9. The method of claim 8, wherein the boron-carbon amorphous film has an elastic modulus (GPa) from about 200 GPa to about 400 GPa and a stress from about-100 MPa to about 100 MPa.

10. The method of claim 8, further comprising:
prior to the exposing the substrate to the boron-containing gas mixture, stabilizing a pressure in the processing chamber for a predefined RF-on delay time period.

11. The method of claim 10, wherein the predefined RF-on delay time period is between about 0.1 seconds and 5 seconds.

12. The method of claim 10, wherein the predefined RF-on delay time period is a fixed time delay defined as a time period between flowing the boron-containing gas mixture into the processing chamber and generating an RF plasma.

13. The method of claim 12, wherein a length of the predefined RF-on delay time period is selected so that the boron-containing gas mixture does not begin to thermally decompose or substantially thermally decompose in a processing volume of the processing chamber.

14. The method of claim 8, wherein the boron-containing gas mixture contains 5% or 20% of diborane and 80% or 95% of hydrogen-containing gas.

15. A controller configured to perform operations comprising:
exposing a substrate in a processing volume to a boron-containing gas mixture, a hydrocarbon-containing gas mixture, and a nitrogen-containing gas in the presence of RF power to deposit a boron-carbon amorphous film over the substrate, wherein the substrate is heated to a substrate temperature from about 400 degrees Celsius to about 700 degrees Celsius, and the boron-carbon amorphous film comprises at least 65 atomic percentage of boron, and at least 2 atomic percentage of nitrogen and less than 5 atomic percentage of nitrogen.

16. The controller of claim 15, wherein the boron-carbon amorphous film has an elastic modulus (GPa) from about 200 MPa to about 400 MPa.

17. The controller of claim 15, wherein the boron-carbon amorphous film has a stress from about-100 MPa to about 100 MPa.

18. The controller of claim 15, wherein:
the boron-containing gas mixture comprises diborane (B2H6); and
a hydrocarbon-containing gas mixture comprises propylene (C3H6).

19. The controller of claim 15, wherein the controller is further configured to:
stabilize a pressure in the processing volume for a predefined RF-on delay time period prior to generating an RF plasma in the processing volume, wherein the predefined RF-on delay time period is a fixed time delay defined as a time period between flowing the boron-containing gas mixture into the processing volume and generating the RF plasma.

* * * * *